US006610419B1

(12) United States Patent
Stamm

(10) Patent No.: US 6,610,419 B1
(45) Date of Patent: Aug. 26, 2003

(54) PRODUCT WITH AN ANTICORROSION PROTECTIVE LAYER AND A METHOD FOR PRODUCING AN ANTICORROSION PROTECTIVE

(75) Inventor: Werner Stamm, Mülheim (DE)

(73) Assignee: Siemens Akteingesellschaft, Munich (DE)

(*) Notice: Subject to any disclaimer, the term of this patent is extended or adjusted under 35 U.S.C. 154(b) by 0 days.

(21) Appl. No.: 09/674,328

(22) PCT Filed: Apr. 22, 1999

(86) PCT No.: PCT/DE99/01217

§ 371 (c)(1), (2), (4) Date: Mar. 14, 2001

(87) PCT Pub. No.: WO99/55527

PCT Pub. Date: Nov. 4, 1999

(30) Foreign Application Priority Data

Apr. 29, 1998 (DE) ........................................ 198 19 026

(51) Int. Cl.[7] .......................... B32B 15/04; C23C 16/00

(52) U.S. Cl. ........................ 428/632; 428/469; 428/650; 428/680; 428/332; 428/697; 428/699; 428/701; 428/702; 428/472.2; 416/241 R; 205/184; 427/252

(58) Field of Search ................................ 428/469, 632, 428/650, 655, 652, 667, 680, 681, 332, 472.2, 472, 697, 699, 701, 702; 416/241 R, 241 B; 205/170, 183, 184; 427/252

(56) References Cited

U.S. PATENT DOCUMENTS 4,198,442 A 4/1980 Gupta et al.
4,321,310 A 3/1982 Ulion et al.
4,321,311 A 3/1982 Strangman
4,451,299 A * 5/1984 Smeggil et al.
4,585,481 A 4/1986 Gupta et al.
4,615,864 A * 10/1986 Dardi et al.
5,076,897 A * 12/1991 Wride et al.
5,993,980 A * 11/1999 Schmitz et al.
6,123,997 A * 9/2000 Schaeffer et al.
6,149,389 A * 11/2000 Hennies et al.

FOREIGN PATENT DOCUMENTS

| | | |
|---|---|---|
| DE | 196 09 690 | 10/1997 |
| EP | 042 872 | 6/1982 |
| EP | 412 397 A1 | 2/1991 |
| EP | 486 489 B1 | 5/1992 |
| EP | 718 420 A1 | 6/1996 |
| EP | 846 788 A1 | 10/1998 |
| JP | 9-228021 | 9/1997 |
| WO | 81/01983 | 7/1981 |
| WO | 91/02108 | 2/1991 |

* cited by examiner

*Primary Examiner*—Deborah Jones
*Assistant Examiner*—Jennifer McNeil

(57) ABSTRACT

Product having a layer which protects against corrosion, and process for producing a layer which protects against corrosion. The invention relates to a product (1), in particular a gas-turbine blade (1), having a metallic basic body (2) to which a protective layer (3, 4) for protecting against corrosion is bonded. The protective layer (3, 4) has an inner layer (3) of a first MCrAlY alloy and an outer layer (4) having a second MCrAlY alloy, which is bonded to the inner layer (3). The second MCrAlY alloy is predominantly in the γ-phase. The invention also relates to a process for producing a protective layer (3, 4) in which the outer layer (4) is produced by re-melting a region of the inner layer (3) or by deposition of an MCrAlY alloy from a liquid phase.

22 Claims, 1 Drawing Sheet

PRODUCT WITH AN ANTICORROSION PROTECTIVE LAYER AND A METHOD FOR PRODUCING AN ANTICORROSION PROTECTIVE

BACKGROUND OF THE INVENTION

1. Field of the Invention

The invention relates to a product having a metallic basic body and a protective layer positioned thereon for protecting the basic body against corrosion, in particular when the product is exposed to a hot, aggressive gas. The protective layer contains an alloy of type MCrAlY, where M represents one or more elements selected from the group consisting of iron, cobalt or nickel, Cr represents chromium, Al represents aluminum and Y represents yttrium and/or an element selected from the group consisting of scandium and the rare earths. The invention also relates to a gas-turbine blade having a protective layer and to a process for producing a protective layer for protecting a product against corrosion.

2. Description of the Related Art

EP 0 486 489 B1 has described a corrosion-resistant protective coating for medium and high temperatures of up to 1050° C. for a gas-turbine part made from a nickel-base or cobalt-base alloy. The protective coating contains, in % by weight, 25 to 40% nickel, 28–30% chromium, 7–9% aluminum, 1–2% silicon and 0.3 to 1% of at least one reactive element selected from the rare earths, at least 5% cobalt and, optionally, 0 to 15% of at least one of the elements selected from the group consisting of rhenium, platinum, palladium, zirconium, manganese, tungsten, titanium, molybdenum, niobium, iron, hafnium and tantalum. In the specific embodiments described, the protective coating contains only the elements nickel, chromium, aluminum, silicon, yttrium and, in addition, rhenium in a range from 1 to 15%, remainder cobalt. The addition of the rhenium significantly improves the corrosion properties. U.S. Pat. No. 4,321,310 and U.S. Pat. No. 4,321,311, as well as EP 0 042 872 B1, which corresponds to the latter, each describe a gas-turbine component which has a basic body made of a nickel-base superalloy (MAR-M 200). A layer of an MCrAlY alloy, in particular an NiCoCrAlY alloy with 18% chromium, 23% cobalt, 12.5% aluminum, 0.3% yttrium, remainder nickel, is applied to the base material. This layer of the MCrAlY alloy, according to U.S. Pat. No. 4,321,310 has a polished surface to which an aluminum oxide layer is applied. The other two patents listed also have an aluminum oxide layer. A ceramic thermal barrier coating which has a columnar structure is applied to this aluminum oxide layer.

U.S. Pat. No. 4,585,481 has likewise disclosed protective layers for protecting a metallic substrate made from a superalloy against high-temperature oxidation and corrosion. MCrAlY alloys are used for the protective layers. This document specifies 5 to 40% chromium, 8–35% aluminum, 0.1 to 2% of an oxygen-active element from group IIIB of the Period System, including the lanthanides and actinides and mixtures thereof, 0.1 to 7% silicon, 0.1 to 3% hafnium, remainder comprising nickel and/or cobalt. The corresponding protective layers of MCrAlY alloy are, according to U.S. Pat. No. 4,585,481 applied by means of a plasma spraying process.

German laid-open specification DE 196 09 698 A1 has disclosed a turbine blade with a corrosion resistant MCrAlY protective layer, in which the surface layer of the MCrAlY protective layer, over a large area and down to a depth of 5 to 50 μm, consists uniformly over the entire surface layer of a single-phase alloy, the single-phase alloy being produced by re-melting using a pulsed electron beam. Brief diffusion and rapid cooling of the protective layer, so that there is no time for phase segregation, results in the single-phase structure which leads to the formation of uniform, uninterrupted coating layers of aluminum oxide with an interrupted structure, there is a reduced tendency to spall (flake). In coating layers with an interrupted structure with some flaking, such damage to the oxide coating layer can be healed by migration of aluminum from the protective layer. However, this may lead to the levels of aluminum in the MCrAlY protective layer becoming depleted. Re-melting with a pulsed electron beam eliminates production-related micro-roughness of the surface through the process of surface treatment and therefore reduces heat transfer between a hot gas and the surface of the protective layer, which would allow a higher gas temperature for a gas turbine.

WO 81/01983 A1 has disclosed a process for the production of a metallic component which includes a ceramic thermal barrier coating. In this process, a thin layer of MCrAlY alloy is applied to the substrate made from a superalloy with a clean surface, this layer is polished, and then an aluminum oxide layer is applied and a columnar ceramic layer is produced on the aluminum oxide layer by means of vapor deposition.

EP 0 846 788 A1 relates to a product, in particular a gas turbine component, having a substrate on which a protective layer of an alloy of type MCrAlY is arranged and on this protective layer there is a ceramic thermal barrier coating. The substrate is a nickel-based superalloy which contains chromium. An outer layer of the substrate is chromium-enriched, this chromium having diffused into the substrate by a diffusion process. The chromium has diffused into the substrate and forms a matrix which contains chromium in the gamma phase dissolved in the nickel. The diffusion of the chromium is carried out using the so-called "chromizing" process.

EP 0 718 420 A1 has described a process for applying a thermal barrier coating to a component made from a superalloy. The thermal barrier coating is in this case composed of various layers. A layer of a metal from the platinum group directly adjoins the product made from the superalloy. This layer of the metal from the platinum group comprises an outer layer and an inner layer, the outer layer containing the metal of the platinum group in the γ-phase. An aluminum-containing coating is arranged on the outer part of the layer of the metal from the platinum group. A thin oxide layer is applied to this aluminum-containing coating, and a ceramic coating is in turn applied to the thin oxide layer.

U.S. Pat. No. 4,321,310 and U.S. Pat. No. 4,321,311 have each disclosed coating systems for a component of a turbine in which a protective layer of an MCrAlY alloy is applied to the component, this protective layer being adjoined by an aluminum oxide layer as adhesion-promoter layer or bonding layer, to which a ceramic thermal barrier coating is applied. Both documents deal with the problem on which this coating system is based of bonding the thermal barrier coating to the MCrAlY protective layer via the aluminum oxide bonding layer. To improve the bonding, according to U.S. Pat. No. 4,321,310 the surface of the aluminum oxide bonding layer is to be polished. According to U.S. Pat. No. 4,321,311, a novel microstructure of the ceramic thermal barrier coating is proposed in order to improve the bonding.

SUMMARY OF THE INVENTION

An object of the invention is to provide a product having a metallic basic body and a coating system which is applied thereto and comprises a protective layer, a bonding layer and a thermal barrier coating, and a process for producing a coating system of this type, in which good bonding of the thermal barrier coating is ensured.

According to the invention, the object relating to a product having a metallic basic body is achieved by the fact that a protective layer of an MCrAlY alloy is applied to the basic body, a thin bonding layer containing aluminum oxide is applied to the protective layer and a thermal barrier coating is applied to this thin boding layer, the protective layer having an inner layer of a first MCrAlY alloy and an outer layer of a second MCrAlY alloy which is predominantly in the γ-phase, and the aluminum oxide being predominantly in the α-phase. The term alloy of type MCrAlY is understood as meaning an alloy which comprises an amount of chromium, of aluminum and a reactive element such as yttrium and/or at least one equivalent metal selected from the group consisting of scandium and the rare earths.

In addition or as an alternative to yttrium, there may be further elements in the alloy, such as for example rhenium, silicon, hafnium, tantalum, zirconium, tungsten, magnesium or niobium. In particular, a rhenium content may lead to an improvement in the corrosion properties. As the remainder the MCrAlY alloy contains one or more elements selected from the group consisting of iron, cobalt and nickel, this being symbolically abbreviated by M.

An MCrAlY alloy of this type is preferably used as an anti-corrosion layer on metallic components, in particular having a basic body made from a superalloy (nickel or cobalt superalloy, if appropriate also iron superalloy) which is exposed to an elevated temperature and a hot, aggressive gas. The decisive advantage of the MCrAlY alloy described here is that it is eminently suitable as an adhesion layer for secure and permanent bonding of the thermal barrier coating. The result is a coating system which inhibits both corrosion and oxidation and allows the product to be used at a high temperature of, for example, over 1000° C.

On account of the outer layer, which contains an MCrAlY alloy which is predominantly in the γ-phase, in the event of oxidation of the outer layer an aluminum oxide grows on (thermally grown oxide), and this oxide is in the α-modification in the regions of the γ-phase of the MCrAlY alloy. Therefore, the aluminum oxide is predominantly in the stable α-modification as early as the initial stage of growth of the aluminum oxide layer. This has the advantage that, compared to aluminum oxide which initially grows on in the θ-phase, the aluminum oxide layer grows on with a greater density, a lower oxidation rate and a smoother structure, so that longer adhesion of the aluminum oxide layer to the outer layer is ensured. In this matter, the invention is based on the recognition that, partially or completely, a θ-phase of the aluminum oxide is formed on an MCrAlY layer surface in the initial stage of oxidation wherever the MCrAlY alloy is in the β-phase. The aluminum oxide which grows on in the θ-phase has a low density, a high oxidation rate and a pointed structure, so that, although subsequently, beyond a certain layer of thickness, the stable α-modification is established, failure, i.e. flaking, of the aluminum oxide layer may occur. Therefore, it is particularly advantageous if the MCrAlY alloy in the outer layer is almost entirely in single phase form in the γ-phase. This also results in good bonding of thermal barrier coatings, in particular ceramic layers which are applied by means of an electron beam PVD process, to an adhesion-promoter layer comprising an MCrAlY alloy. Due to the thin aluminum oxide layer in the stable α-modification which forms, the bonding to the MCrAlY alloy, which is substantially in the γ-phase, is significantly better than the bonding to an MCrAlY alloy which has regions containing the β-phase and has been mechanically smoothed. This is because the mechanically smoothed MCrAlY alloy which is predominantly in the β-phase leads to a significantly thicker aluminum oxide layer in the θ-phase growing on, the greater thickness and the layer growth of this aluminum oxide layer leading to flaking of the aluminum oxide layer after even a relatively short time.

The second MCrAlY alloy preferably has the same chemical composition as the first MCrAlY alloy, although, depending on the properties of the individual alloying constituents, there may also be differences of a few percent by weight or a few tenths of a percent by weight between the respective, corresponding alloying constituents of the first MCrAlY alloy and the second MCrAlY alloy. It is also possible for the second MCrAlY alloy to contain additional or alternative alloying elements to the first MCrAlY alloy.

The outer layer is preferably on average between 5 μm and 50 μm thick, in particular less than 20 μm thick. The total mean layer thickness of the protective layer is preferably between 100 μm and 200 μm.

Preferably, the first MCrAlY alloy and/or the second MCrAlY alloy contain(s) the following alloying constituents (data in percent by weight): 15 to 35% chromium; 7 to 18% aluminum; 0.3 to 2% yttrium and/or at least one equivalent element selected from the group consisting of scandium and the rare earths, and, optionally, 0 to 20% rhenium and further optional alloying elements, such as hafnium, silicon, tantalum, zirconium, tungsten, magnesium and niobium. The rhenium content is preferably between 1% and 20%, in particular between 5% and 11%.

A thin bonding layer substantially comprising aluminum oxide ($Al_2O_3$) which is in the α-phase is preferably bonded to the outer layer. At the beginning of an oxidation process, the thickness of the bonding layer is preferably between 0.3 μm and 0.6 μm. Due to the high level of aluminum oxide in the α-phase, preferably virtually exclusively aluminum oxide in the α-phase, in the event of oxidation of the MCrAlY alloy in the outer layer, the bonding layer grows with a significantly lower growth rate than if there is a high level of aluminum oxide in the θ-phase. In this case, a bonding layer which contains almost exclusively aluminum oxide in the α-phase from the beginning of an oxidation process is particularly advantageous, since this ensures uniform, homogenous, low growth of the bonding layer.

The thermal barrier coating which has been applied to the bonding layer preferably contains a columnar microstructure, the axial direction of the crystallites which are present in the columnar microstructure being substantially perpendicular to the surface of the basic body. The thermal barrier coating is preferably between 150 and 3500 μm, preferably approximately 200 μm, thick. The columnar, stalk-like crystallites preferably have a mean diameter of less than 5 μm, in particular less than 2.5 μm. In this case the thermal barrier coating preferably contains a ceramic which is in particular zirconium oxide partially stabilized with yttrium oxide. Depending on the demands imposed on the product, it is also possible to use other thermal barrier layers comprising tertiary oxides, spinels or mullites.

The product is preferably a component of a gas turbine, in particular a gas-turbine blade, a rotor blade or a guide vane. Gas-turbine blades in the first two rows of guide vanes and the first rows of rotor blades immediately downstream of a combustion chamber of a gas turbine are preferably coated with a protective layer of the abovementioned type and a thermal barrier coating which is bonded on via a bonding layer of aluminum oxide.

The outer layer of the protective layer is preferably produced by re-melting the inner layer in the region of its surface, i.e., a region of the inner layer is re-melted. This re-melting is preferably carried out by electron beams or ion beams which bring about rapid re-melting without a significant change in the chemical composition of the MCrAlY alloy in the outer layer and the inner layer. As a result of melting of the free, i.e. untreated, surface of the MCrAlY alloy of the inner layer by electron beams, ion beams or the like, it is possible to produce a substantially pure, temperature-stable γ-phase which forms the outer layer in the upper peripheral regions of a few micrometers. This γ-phase, as stated above, leads to a stable, dense and thin α-aluminum oxide layer, the bonding layer, being formed immediately during the a formation of an oxide layer on the surface of the outer layer. The oxide formed by oxidation, which is predominantly aluminum oxide, is referred to as thermally grown oxide (TGO) The formation of this oxide, the bonding layer, may occur both before application of the thermal barrier coating and during and after the application of the thermal barrier coating. The thermal barrier coating is, in this case, preferably applied by vapor deposition. On account of the low growth rate and homogenous structure of the thermally grown oxide (TGO), the stresses in the region of the thermally grown oxide, the bonding layer, when the product is used at a high temperature in an oxidizing and corrosive environment, in particular when a hot, aggressive gas is flowing around it, are reduced. As a result, the service life of thermal barrier layers which are bonded on to the basic body via the bonding layer and the protective layer is increased, since flaking of the bonding layer takes place at a later time due to the reduced growth of the thermally grown oxide.

It is also possible for the outer layer to be applied from a liquid phase, in particular by electrodeposition, to an inner layer of an MCrAlY alloy which has already been applied. In this case, the inner layer may be applied to the basic body in a suitable way, if appropriate likewise by deposition from a liquid phase. In this case, the second MCrAlY alloy of the outer layer has the composition of a γ-phase. The first MCrAlY alloy may be sprayed on by conventional means.

According to the invention, the object relating to a process for producing a protective layer on a metallic basic body of a product is achieved by the fact that an inner layer having a first MCrAlY alloy is applied, and this inner layer is re-melted in the region of its free surface in such a way that an outer layer is formed, in which the MCrAlY alloy is substantially in the γ-phase. Alternatively, it is possible for a second MCrAlY alloy to be deposited from a liquid phase, in particular by electrodeposition, onto the first MCrAlY alloy, which forms the inner layer and has been sprayed on by conventional means or has been electrodeposited, the second MCrAlY alloy forming the outer layer and being substantially in the γ-phase.

According to the invention, the object relating to a gas-turbine blade having a metallic basic body, is achieved by the fact that a protective layer (adhesion layer) for protecting against corrosion is bonded to the metallic basic body, this protective layer containing an inner layer of a first adhesion alloy which is bonded to the basic body, and an outer layer having a second adhesion alloy, which is bonded to the inner layer, the second adhesion layer being predominantly, preferably almost completely, in the γ-phase, and a thin bonding layer containing aluminum oxide predominantly in the α-phase being bonded to the outer layer, with a thermal barrier coating bonded to this thin bonding layer. The first adhesion alloy and the second adhesion alloy are preferably each an (identical) alloy of type MCrAlY, modified according to requirements by the addition of one or more alloying elements, in particular rhenium.

The basic body, preferably consists of a nickel-base or cobalt-base superalloy, if appropriate also an iron-based superalloy.

The product, in particular the gas-turbine blade, having the protective layer, the bonding layer and the thermal barrier coating, is explained in more detail with reference to the exemplary embodiment illustrated in the drawing, in which, partially in diagrammatic form and not to scale,

DETAILED DESCRIPTION OF THE INVENTION

Figure 2:
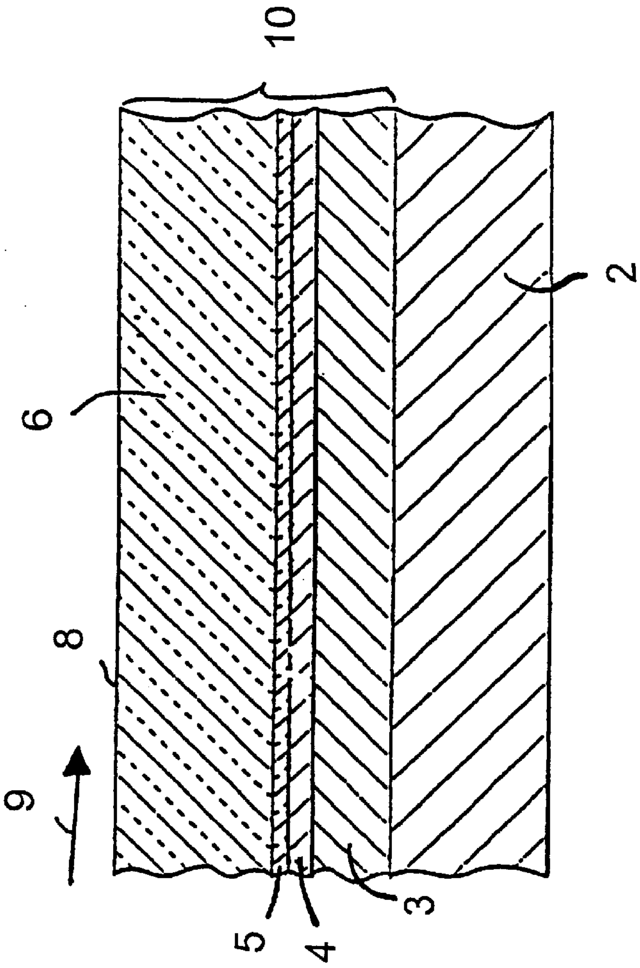
FIG. 2 shows part of a section perpendicular to the surface of the gas-turbine rotor blade.
Figure 1:
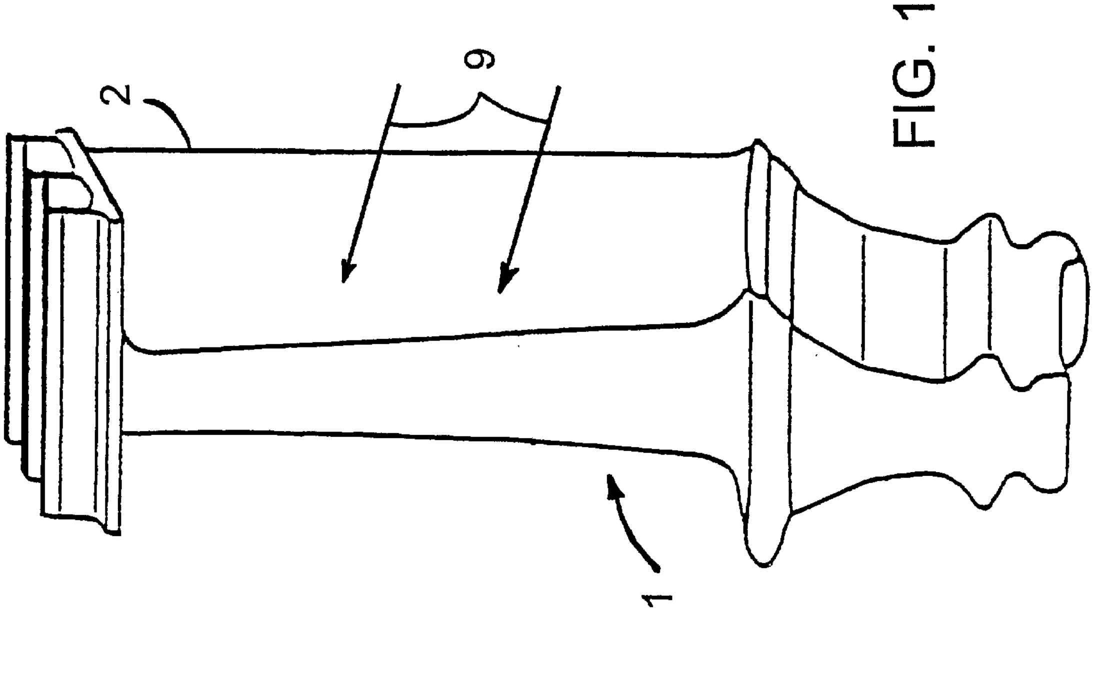
FIG. 1 shows a perspective view of a gas-turbine rotor blade.

The product 1 illustrated in FIG. 1, which is a gas-turbine rotor blade 1, has a metallic basic body 2 made from a nickel-base or cobalt-base superalloy. As shown in FIG. 2, a protective layer 3, 4, which serves as an adhesion layer and comprises an inner layer 3 which is directly bonded to the basic body 2 and an outer layer 4 which is bonded to inner layer 3, is applied to the basic body 2. The inner layer 3 contains a first alloy of type MCrAlY, and the outer layer has a second alloy, likewise of type MCrAlY, the second alloy being substantially preferably almost entirely in the γ-phase. A thermal barrier coating 6, which preferably comprises a columnar ceramic, for example zirconium oxide which is partially stabilized with yttrium oxide, is bonded to this protective layer 3, 4, which serves as an adhesion layer. A bonding layer 5 is arranged between the protective layer 3, 4 and the thermal barrier coating 6. This bonding layer 5 preferably consists of a thermally grown oxide, in particular aluminum oxide. Even at the beginning of oxidation, this thermally grown oxide is in the stable α-phase, the immediate formation of the α-phase being brought about at the beginning of oxidation by the γ-phase in the outer layer 4. Compared to a thermally grown oxide which grows on predominantly in the β-phase, the oxide which grows on in the stable α-phase has a significantly lower layer thickness. The result is not only good bonding of the thermal barrier coating to the protective layer 3, 4 but also a significant extension of the service life of the thermal barrier coating 6 on account of the fact that detachment of the bonding layer 5 caused by high layer growth, as would be found with an oxide in the β-phase, is prevented.

When the gas-turbine rotor blade 1 is being used in a gas turbine (not shown), a hot, aggressive gas 9 flows past the outer surface 8 of the thermal barrier coating 6, and this gas is effectively kept away from the metallic basic body 2, both in physical and chemical terms, by the layer system formed from the protective layer 3, 4, the bonding layer 5 and the thermal barrier layer 6. This is particularly advantageous in a gas-turbine rotor blade 1 and in a gas-turbine guide vane which is exposed to the hot gas flowing directly out of a combustion chamber (not shown) at a temperature of up to over 1300° C.

What is claimed is:

1. A component for a gas turbine, comprising:

a metallic base body;

a protective layer having an inner layer of a first MCrAlY alloy bonded to said metallic base body and an outer layer of a second MCrAlY alloy predominantly in the γ-phase formed on the inner layer;

a thin bonding layer containing aluminum oxide predominately in the α-phase applied to said protective layer; and a thermal barrier coating applied to said thin bonding layer, where M represents at least one of Fe, Ni, Co and Y represents at least one of yttrium and at least one equivalent element selected from the group consisting of scandium and the rare earths.

2. The component as claimed in claim 1, wherein the second MCrAlY alloy and the first MCrAlY alloy have substantially identical chemical compositions.

3. The component as claimed in claim 2, wherein the outer layer is between 5 μm and 50 μm thick.

4. The component as claimed in claim 3, wherein the outer layer is between 5 μm and 20 μm thick.

5. The component as claimed in claim 3, wherein at least one of the first MCrAlY alloy and the second MCrAlY alloy contains as alloying constituents in percent by weight: 15% to 35% chromium; 7% to 18% aluminum; at least one of 0.3% to 2% yttrium and at least one equivalent element metal selected from the group consisting of scandium, and the rare earths; and 0% to 20% rhenium.

6. The component as claimed in claim 5, wherein the rhenium content is between 5% and 11%.

7. The component as claimed in claim 5, wherein the rhenium content is between 1% and 20%.

8. The component as claimed in claim 1, wherein the thermal barrier coating has a columnar microstructure with an axial direction of crystallites substantially perpendicular to a surface of said metallic base body.

9. The component as claimed in claim 8, wherein the thermal barrier coating contains zirconium oxide partially stabilized with yttrium oxide.

10. The component as claimed in claim 1, wherein:

the outer layer is a free surface portion of the inner layer, and the free surface portion is a layer re-melted by at least one of electron beams and ion beams.

11. The component as claimed in claim 1, wherein the outer layer is an electrodeposited MCrAlY alloy predominately in the γ-phase.

12. The component as claimed in claim 1, wherein the outer layer of the second MCrAlY alloy is almost entirely in the γ-phase.

13. A process for producing a coating system with a protective layer, a bonding layer and a thermal barrier coating on a metallic base body of a product, comprising:

applying an inner layer having an MCrAlY alloy to the metallic base body for the protective layer;

remelting the inner layer in a free surface region thereof, in such a way that an outer layer is formed with the MCrAlY alloy substantially in the γ-phase;

forming the bonding layer, containing aluminum oxide predominantly in the α-phase, on the outer layer; and applying the thermal barrier coating to the bonding layer.

14. The process as claimed in claim 13, wherein the forming of the bonding layer includes forming 0.3 μm to 0.6 μm of the bonding layer at a beginning of an oxidation process thereof.

15. A process for producing a coating system with a protective layer, a bonding layer and a thermal barrier coating on a metallic base body of a product, comprising:

applying an inner layer, formed of a first MCrAlY alloy, to the metallic base body for the protective layer;

depositing a second MCrAlY alloy from a liquid phase, by electrodeposition, on the inner layer to form an outer layer substantially in the γ-phase;

forming the bonding layer, containing aluminum oxide predominantly in the α-phase, on the outer layer; and applying the thermal barrier coating to the bonding layer.

16. The process as claimed in claim 15, wherein the forming of the bonding layer includes forming 0.3 μm to 0.6 μm of the bonding layer at a beginning of an oxidation process thereof.

17. A component for a gas turbine, comprising:

a metallic base body;

a protective layer having an inner layer of a first MCrAlY alloy bonded to said metallic base body and an outer layer of a second MCrAlY alloy predominantly in the γ-phase formed on the inner layer;

a thin bonding layer containing aluminum oxide predominately in the α-phase applied to said protective layer; and a thermal barrier coating applied to said thin bonding layer, where M represents at least one of Fe, Ni, Co, Y represents at least one of yttrium and at least one equivalent element selected from the group consisting of scandium and the rare earths, and the first and second MCrAlY alloys include zirconium.

18. A component for a gas turbine, comprising:

a metallic base body;

a protective layer having an inner layer of a first MCrAlY alloy bonded to said metallic base body and an outer layer of a second MCrAlY alloy predominantly in the γ-phase formed on the inner layer, where M represents at least one of Fe, Ni, Co, Y represents at least one of yttrium and at least one equivalent element selected from the group consisting of scandium and the rare earths, and the outer layer has a structure other than a remelted structure of the inner layer;

a thin bonding layer containing aluminum oxide predominately in the α-phase applied to said protective layer; and a thermal barrier coating applied to said thin bonding layer.

19. The component as claimed in claim 18, wherein at least one of the first MCrAlY alloy and the second MCrAlY alloy includes rhenium.

20. The component as claimed in claim 18, wherein at least one of the first MCrAlY alloy and the second MCrAlY alloy includes zirconium.

21. A process for producing a coating system with a protective layer, a bonding layer and a thermal barrier coating on a metallic base body of a product, comprising:

applying an MCrAlY alloy layer to the metallic base body to form an inner protective layer, where M represents a metal and Y represents at least one of yttrium and at least one equivalent element selected from the group consisting of scandium and the rare earths;

forming an outer protective layer on the inner protective layer, from an MCrAlY alloy substantially in the γ-phase, the outer protective layer being formed by a process other than remelting the inner protective layer;

forming the bonding layer, containing aluminum oxide predominantly in the α-phase, on the outer layer; and applying the thermal barrier coating to the bonding layer.

22. The process as claimed in claim 21, wherein the forming of the bonding layer includes forming 0.3 μm to 0.6 μm of the bonding layer at a beginning of an oxidation process thereof.

* * * * *